(12) United States Patent
Yang et al.

(10) Patent No.: US 10,152,999 B2
(45) Date of Patent: Dec. 11, 2018

(54) SYSTEMS AND METHODS FOR CORRELATION BASED DATA ALIGNMENT

(71) Applicant: Avago Technologies International Sales Pte. Limited, Singapore (SG)

(72) Inventors: Shaohua Yang, San Jose, CA (US); George Mathew, San Jose, CA (US); Jefferson E. Singleton, Westminster, CO (US); Jongseung Park, Allentown, PA (US); Richard Rauschmayer, Longmont, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 800 days.

(21) Appl. No.: 13/952,415

(22) Filed: Jul. 26, 2013

(65) Prior Publication Data
US 2015/0012800 A1   Jan. 8, 2015

Related U.S. Application Data

(60) Provisional application No. 61/842,902, filed on Jul. 3, 2013.

(51) Int. Cl.
| | |
|---|---|
| *G06F 11/07* | (2006.01) |
| *G11B 20/18* | (2006.01) |
| *G11B 20/10* | (2006.01) |
| *H03M 13/29* | (2006.01) |
| *H03M 13/37* | (2006.01) |

(Continued)

(52) U.S. Cl.
CPC .... *G11B 20/1833* (2013.01); *G11B 20/10268* (2013.01); *H03M 13/2957* (2013.01); *H03M 13/3723* (2013.01); *H03M 13/3738* (2013.01); *H03M 13/3746* (2013.01); *H03M 13/3753* (2013.01); *H03M 13/6325* (2013.01);

(Continued)

(58) Field of Classification Search
CPC ............ G06F 11/0727; G06F 11/1076; G11B 20/1833; G11B 20/18; G11B 20/1217; G11B 20/10
See application file for complete search history.

(56) References Cited

U.S. PATENT DOCUMENTS

| | | |
|---|---|---|
| 4,777,544 A | 10/1988 | Brown et al. |
| 5,130,866 A | 7/1992 | Klaassen et al. |

(Continued)

FOREIGN PATENT DOCUMENTS

| | | |
|---|---|---|
| FR | 2904168 A1 | 1/2008 |
| WO | WO 03/047091 | 6/2003 |
| WO | WO 08/09620 | 1/2008 |

OTHER PUBLICATIONS

U.S. Appl. No. 13/529,572, filed Jun. 21, 2012, Yang et al.

(Continued)

*Primary Examiner* — Kyle Vallecillo
(74) *Attorney, Agent, or Firm* — Sheridan Ross P.C.

(57) ABSTRACT

A data processing system is disclosed including a data detector, a data decoder and an alignment detector. The data detector is operable to apply a data detection algorithm to generate detected values for a data sector. The data decoder is operable to apply a data decode algorithm to a decoder input derived from the detected values to yield decoded values. The alignment detector is operable to calculate an offset between multiple versions of the data sector by correlating the multiple versions.

20 Claims, 7 Drawing Sheets

(51) Int. Cl.
*H03M 13/00* (2006.01)
*H03M 13/11* (2006.01)
*H03M 13/15* (2006.01)

(52) U.S. Cl.
CPC .... *H03M 13/6343* (2013.01); *H03M 13/1102* (2013.01); *H03M 13/1515* (2013.01)

(56) References Cited

U.S. PATENT DOCUMENTS

| | | |
|---|---|---|
| 5,237,325 A | 8/1993 | Klein et al. |
| 5,278,703 A | 1/1994 | Rub et al. |
| 5,309,357 A | 5/1994 | Stark et al. |
| 5,341,249 A | 8/1994 | Abbott et al. |
| 5,377,058 A | 12/1994 | Good et al. |
| 5,521,948 A | 5/1996 | Takeuchi |
| 5,523,902 A | 6/1996 | Pederson |
| 5,594,341 A | 1/1997 | Majidi-Ahy |
| 5,668,679 A | 9/1997 | Swearingen et al. |
| 5,696,639 A | 12/1997 | Spurbeck et al. |
| 5,768,044 A | 6/1998 | Hetzler |
| 5,781,129 A | 7/1998 | Schwartz et al. |
| 5,798,885 A | 8/1998 | Saiki et al. |
| 5,835,295 A | 11/1998 | Behrens |
| 5,844,920 A | 12/1998 | Zook et al. |
| 5,852,524 A | 12/1998 | Glover et al. |
| 5,892,632 A | 4/1999 | Behrens |
| 5,955,783 A | 9/1999 | Ben-Efraim |
| 5,970,104 A | 10/1999 | Zhong et al. |
| 5,986,830 A | 11/1999 | Hein |
| 5,987,562 A | 11/1999 | Glover |
| 6,009,549 A | 12/1999 | Bliss et al. |
| 6,023,383 A | 2/2000 | Glover et al. |
| 6,069,583 A | 5/2000 | Silverstrin et al. |
| 6,081,397 A | 6/2000 | Belser |
| 6,111,712 A | 8/2000 | Vishakhadatta et al. |
| 6,208,478 B1 | 3/2001 | Chiu et al. |
| 6,269,058 B1 | 7/2001 | Yamanoi et al. |
| 6,278,591 B1 | 8/2001 | Chang |
| 6,400,518 B1 | 6/2002 | Bhaumik et al. |
| 6,404,829 B1 | 6/2002 | Sonu |
| 6,411,452 B1 | 6/2002 | Cloke |
| 6,441,661 B1 | 8/2002 | Aoki et al. |
| 6,476,989 B1 | 11/2002 | Chainer |
| 6,490,110 B2 | 12/2002 | Reed et al. |
| 6,493,162 B1 | 12/2002 | Fredrickson |
| 6,519,102 B1 | 2/2003 | Smith et al. |
| 6,530,060 B1 | 3/2003 | Vis et al. |
| 6,603,622 B1 | 8/2003 | Christiansen et al. |
| 6,606,048 B1 | 8/2003 | Sutardja |
| 6,633,447 B2 | 10/2003 | Franck et al. |
| 6,646,822 B1 | 11/2003 | Tuttle et al. |
| 6,657,802 B1 | 12/2003 | Ashley et al. |
| 6,671,404 B1 | 12/2003 | Kawatani |
| 6,717,764 B2 | 4/2004 | Lake |
| 6,775,529 B1 | 8/2004 | Roo |
| 6,788,484 B2 | 9/2004 | Honma |
| 6,813,108 B2 | 11/2004 | Annampedu et al. |
| 6,816,328 B2 | 11/2004 | Rae |
| 6,839,014 B2 | 1/2005 | Uda |
| 6,856,183 B2 | 2/2005 | Annampedu |
| 6,865,040 B2 | 3/2005 | Fayeulle et al. |
| 6,876,511 B2 | 4/2005 | Koyanagi |
| 6,906,990 B2 | 6/2005 | Nagata et al. |
| 6,912,099 B2 | 6/2005 | Annampedu et al. |
| 6,963,521 B2 | 11/2005 | Hayashi |
| 6,980,382 B2 | 12/2005 | Hirano et al. |
| 6,999,257 B2 | 2/2006 | Takeo |
| 6,999,264 B2 | 2/2006 | Ehrlich |
| 6,999,404 B2 | 2/2006 | Furumiya et al. |
| 7,002,761 B1 | 2/2006 | Sutardja et al. |
| 7,016,131 B2 | 3/2006 | Liu et al. |
| 7,038,875 B2 | 5/2006 | Lou et al. |
| 7,054,088 B2 | 5/2006 | Yamazaki et al. |
| 7,072,137 B2 | 7/2006 | Chiba |
| 7,082,005 B2 | 7/2006 | Annampedu et al. |
| 7,092,462 B2 | 8/2006 | Annampedu et al. |
| 7,116,504 B1 | 10/2006 | Oberg |
| 7,126,776 B1 | 10/2006 | Warren, Jr. et al. |
| 7,133,227 B2 | 11/2006 | Chiang |
| 7,136,250 B1 | 11/2006 | Wu et al. |
| 7,154,689 B1 | 12/2006 | Shepherd et al. |
| 7,158,464 B2 | 1/2007 | Gushima et al. |
| 7,167,328 B2 | 1/2007 | Annampedu et al. |
| 7,180,693 B2 | 2/2007 | Annampedu et al. |
| 7,187,739 B2 | 3/2007 | Ma |
| 7,191,382 B2 | 3/2007 | James et al. |
| 7,193,544 B1 | 3/2007 | Fitelson et al. |
| 7,193,798 B2 | 3/2007 | Byrd et al. |
| 7,199,961 B1 | 4/2007 | Wu et al. |
| 7,203,013 B1 | 4/2007 | Han et al. |
| 7,203,015 B2 | 4/2007 | Sakai et al. |
| 7,206,146 B2 | 4/2007 | Flynn et al. |
| 7,230,789 B1 | 6/2007 | Brunnett et al. |
| 7,248,425 B2 | 7/2007 | Byun et al. |
| 7,253,984 B1 | 8/2007 | Patapoutian et al. |
| 7,265,937 B1 | 9/2007 | Erden et al. |
| 7,286,313 B2 | 10/2007 | Erden et al. |
| 7,301,717 B1 | 11/2007 | Lee et al. |
| 7,308,057 B1 | 12/2007 | Patapoutian |
| 7,323,916 B1 | 1/2008 | Sidiropoulos et al. |
| 7,362,536 B1 | 4/2008 | Liu et al. |
| 7,375,918 B1 | 5/2008 | Shepherd et al. |
| 7,394,608 B2 | 7/2008 | Eleftheriou |
| 7,411,531 B2 | 8/2008 | Aziz et al. |
| 7,420,498 B2 | 9/2008 | Barrenscheen |
| 7,423,827 B2 | 9/2008 | Neville |
| 7,446,690 B2 | 11/2008 | Kao |
| 7,525,460 B1 | 4/2009 | Liu et al. |
| 7,529,320 B2 | 5/2009 | Byrne et al. |
| 7,558,177 B2 | 7/2009 | Ogura et al. |
| 7,602,567 B2 | 10/2009 | Park |
| 7,602,568 B1 | 10/2009 | Katchmart |
| 7,616,395 B2 | 11/2009 | Yamamoto |
| 7,620,101 B1 | 11/2009 | Jenkins |
| 7,630,155 B2 | 12/2009 | Maruyama et al. |
| 7,643,235 B2 | 1/2010 | Erden et al. |
| 7,656,982 B2 | 2/2010 | Gaedke |
| 7,663,831 B2 | 2/2010 | Hayashi et al. |
| 7,679,850 B2 | 3/2010 | Smith |
| 7,693,243 B2 | 4/2010 | Chen et al. |
| 7,738,200 B2 | 6/2010 | Annampedu |
| 7,768,437 B2 | 8/2010 | Annampedu |
| 7,768,730 B2 | 8/2010 | Bliss et al. |
| 7,796,480 B2 | 9/2010 | Cheng et al. |
| 7,813,065 B2 | 10/2010 | Annampedu |
| 7,821,730 B2 | 10/2010 | Cao |
| 7,835,104 B2 | 11/2010 | Yamashita |
| 7,889,823 B2 | 2/2011 | Yang |
| 7,929,237 B2 | 4/2011 | Grundvig |
| 8,014,099 B2 | 9/2011 | Mathew |
| 8,054,573 B2 | 11/2011 | Mathew |
| 8,054,931 B2 | 11/2011 | Annampedu |
| 8,059,349 B2 | 11/2011 | Annampedu |
| 8,098,451 B2 | 1/2012 | Graef |
| 8,102,960 B2 | 1/2012 | Ran et al. |
| 8,107,573 B2 | 1/2012 | Chang |
| 8,154,818 B2 | 4/2012 | Mathew |
| 8,154,972 B2 | 4/2012 | Ratnakar Aravind |
| 8,169,726 B2 | 5/2012 | Wilson |
| 8,174,784 B2 | 5/2012 | Grundvig |
| 8,174,949 B2 | 5/2012 | Ratnakar Aravind |
| 8,237,597 B2 | 8/2012 | Liu |
| 8,243,381 B2 | 8/2012 | Annampedu |
| 8,254,049 B2 | 8/2012 | Annampedu |
| 8,261,171 B2 | 8/2012 | Annampedu |
| 2002/0150179 A1 | 10/2002 | Leis et al. |
| 2005/0243455 A1 | 11/2005 | Annampedu |
| 2007/0104300 A1 | 5/2007 | Esumi et al. |
| 2008/0056403 A1 | 3/2008 | Wilson |
| 2009/0142620 A1 | 6/2009 | Yamamoto et al. |
| 2009/0274247 A1 | 11/2009 | Galbraith et al. |
| 2010/0061490 A1 | 3/2010 | Noelder |
| 2010/0067628 A1 | 3/2010 | Buehner |
| 2010/0142078 A1 | 6/2010 | Annampedu |

(56) References Cited

U.S. PATENT DOCUMENTS

| | | |
|---|---|---|
| 2011/0043938 A1 | 2/2011 | Mathew |
| 2011/0149434 A1* | 6/2011 | Coker et al. ............... 360/77.08 |
| 2011/0157737 A1 | 6/2011 | Grundvig |
| 2011/0209026 A1 | 8/2011 | Xia |
| 2012/0036173 A1 | 2/2012 | Annampedu |
| 2012/0063284 A1* | 3/2012 | Mathew et al. ........... 369/53.44 |
| 2012/0084336 A1 | 4/2012 | Yang |
| 2012/0087035 A1 | 4/2012 | Graef |
| 2012/0106607 A1 | 5/2012 | Miladinovic |
| 2012/0120784 A1 | 5/2012 | Yang |
| 2012/0124241 A1 | 5/2012 | Yang |
| 2012/0134042 A1 | 5/2012 | Annampedu |
| 2012/0134043 A1 | 5/2012 | Annampedu |
| 2012/0155587 A1 | 6/2012 | Annampedu |
| 2012/0182643 A1 | 7/2012 | Zhang |
| 2012/0236428 A1 | 9/2012 | Xia |

OTHER PUBLICATIONS

Annampedu, V. et al "Adaptive Algorithms for Asynchronous Detection of Coded Servo Signals Based on Interpolation", IEEE Transactions on Magnetics, vol. 41, No. 10, Oct. 2005.

Aziz et al., "Asynchronous Maximum Likelihood (ML) Detection of Servo Repeatable Run Out (RRO) Data", Digest, IEEE Intl Mag Conf, vol. 42, No. 10, pp. 2585-2587 (Oct. 2006).

Aziz et al., "Interpolation Based Maximum-Likelihood(ML) Detection of Asynchronous Servo Repeatable Run Out (RRO) Data" IEEE Intl Mag Conf. vol. 42 No. 10 pp. 2585-2587, Oct. 2006.

Hagenauer et al., "A Viterbi algorithm with soft-decision outputs and its applications," in Proc. IEEE Global Telecom Conf 1989, Dallas, Texas, pp. 1680-1686 (Nov. 1989).

Kryder, M. et al "Heat Assisted Magnetic Recording" Proc. IEEE, vol. 96, No. 11, p. 1810, Nov. 2008.

Polikar, Robi "Ensemble Based Systems in Decision Making" IEEE Circuits and Systems Magazine Third qtr 2006, p. 21-47.

U.S. Appl. No. 13/096,873, Unpublished (filed Apr. 28, 2011) (Ross S. Wilson).

U.S. Appl. No. 13/941,464, Unpublished (filed Jul. 13, 2013) (Bruce A. Wilson).

U.S. Appl. No. 13/173,088, Unpublished (filed Jun. 30, 2011) (Jeffrey P. Grundvig).

U.S. Appl. No. 13/186,267, Unpublished (filed Jul. 19, 2011) (Haitao Xia).

U.S. Appl. No. 13/242,983, Unpublished (filed Sep. 23, 2011) (Jeffrey P. Grundvig).

U.S. Appl. No. 13/490,913, Unpublished (filed Jun. 7, 2012) (Xun Zhang).

U.S. Appl. No. 13/491,135, Unpublished (filed Jun. 7, 2012) (Xun Zhang).

U.S. Appl. No. 13/777,937, Unpublished (filed Feb. 26, 2013) (Rui Cao).

U.S. Appl. No. 13/100,021, Unpublished (filed May 3, 2011) (Haitao Xia).

Weller et al "Thermal Limits in Ultrahigh-density Magnetic Recording" IEEE Trans. Magn. vol. 35, No. 6, P. 4423, Nov. 1999.

\* cited by examiner

SYSTEMS AND METHODS FOR CORRELATION BASED DATA ALIGNMENT

CROSS REFERENCE TO RELATED APPLICATIONS

The present application claims priority to (is a non-provisional of) U.S. Pat. App. No. 61/842,902, entitled "Systems and Methods for Correlation Based Data Alignment", and filed Jul. 3, 2013 by Yang et al, the entirety of which is incorporated herein by reference for all purposes.

FIELD OF THE INVENTION

Various embodiments of the present invention provide systems and methods for processing data, and more particularly to systems and methods for correlation based data alignment.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Errors can be detected and corrected in a read channel. When errors are not corrected with normal error correction procedures, retry features may be needed to correct stubborn errors. Some retry features involve combining multiple versions of the same digital data. However, the multiple versions must be aligned before combining, and if markers in the digital data are distorted or otherwise unavailable, the multiple versions cannot be aligned based on the markers.

BRIEF SUMMARY

Embodiments of the present invention provide a data processing system for correlation based data alignment. A data processing system is disclosed including a data detector, a data decoder and an alignment detector. The data detector is operable to apply a data detection algorithm to generate detected values for a data sector. The data decoder is operable to apply a data decode algorithm to a decoder input derived from the detected values to yield decoded values. The alignment detector is operable to calculate an offset between multiple versions of the data sector by correlating the multiple versions.

This summary provides only a general outline of some embodiments according to the present invention. Many other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components.

DETAILED DESCRIPTION OF THE INVENTION

Embodiments of the present invention are related to correlation based data alignment, used to align multiple versions of data without requiring embedded patterns such as a sync mark. In some embodiments, a data processing system obtains multiple versions of data from multiple read back waveforms of a data sector, used, for example, during a retry feature after the first attempt at reading and decoding the data sector fails. Such a retry feature may be, but is not limited to, a data combining operation such as read averaging or joint data detection and decoding, although the correlation based data alignment disclosed herein is not limited to any particular source of data or use of the resulting aligned data.

The correlation based data alignment disclosed herein is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 1:
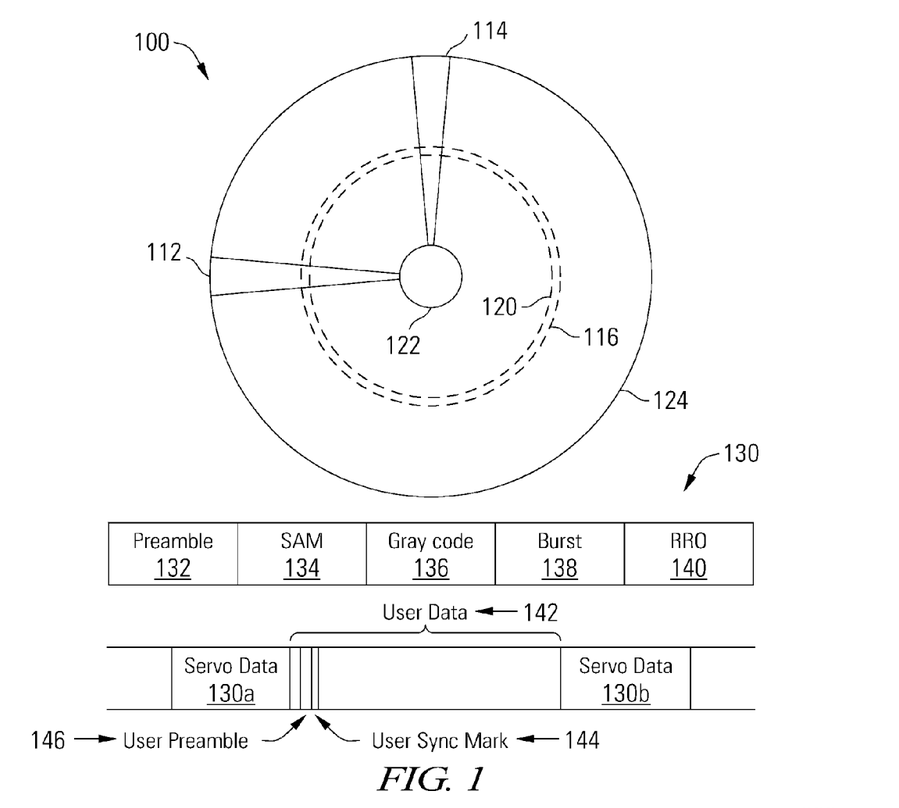
FIG. 1 is a diagram of a magnetic storage medium and sector data scheme that may be processed using correlation based data alignment in accordance with some embodiments of the present invention.

Turning to FIG. 1, in some embodiments, the data to be aligned is read from the magnetic storage medium 100 of a hard drive. The magnetic storage medium 100 is organized using servo wedges (e.g., 112, 114) containing servo data to indicate the location of user data to follow. Two exemplary data tracks 116, 120 are shown, indicated as dashed lines. The tracks 116, 120 are segregated by servo data written within wedges 112, 114. The servo wedges 112, 114 in some embodiments extend from an inner diameter 122 to an outer diameter 124. It should be noted that while two tracks 116, 120 and two servo wedges 112, 114 are shown, hundreds of wedges and tens of thousands of tracks may be included on a given storage medium.

The servo wedges 112, 114 include servo data 130 that is used for control and synchronization of a read/write head assembly over a desired location on storage medium 100. In particular, the servo data 130 generally includes a preamble pattern 132 followed by a servo address mark 134, followed by a Gray code 136, a burst field 138, and a repeatable run-out (RRO) field 140. Between the servo data bit patterns 130a and 130b, a user data region 142 is provided. User data region 142 may include one or more sets of data that are stored to storage medium 100. The data sets may include user synchronization information some of which may be used as a mark to establish a point of reference from which processing of the data within user data region 142 may begin.

However, the correlation based data alignment disclosed herein allows for different versions of data, obtained by multiple read operations of approximately the same location on the storage medium 100, to be aligned without the use of sync marks such as the servo address mark 134 or user sync marks in user data 142. Thus, even if sync marks are included but are unreadable due to media flaws or noise, the multiple versions of the data can be aligned as disclosed herein.

In operation, storage medium 100 is rotated in relation to a sensor that senses information from the storage medium. In a read operation, the sensor would sense servo data from wedge 112 (i.e., during a servo data period) followed by user data from a user data region between wedge 112 and wedge 114 (i.e., during a user data period) and then servo data from wedge 114. In a write operation, the sensor would sense servo data from wedge 112 then write data to the user data region between wedge 112 and wedge 114, with location information in the user data region provided by a user sync mark 144 and a user preamble 146. The signal from the sensor is processed by a read channel circuit, and data from multiple read operations is aligned by calculating the correlation between some or all of the data in the multiple versions.

Figure 2:
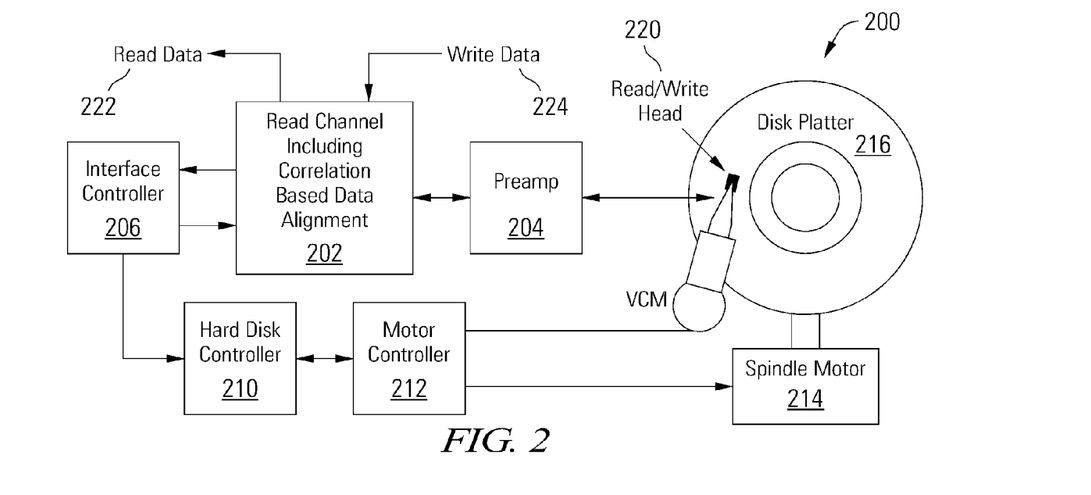
FIG. 2 depicts a storage system including a data processing circuit with correlation based data alignment in accordance with some embodiments of the present invention.

Turning to FIG. 2, a storage system 200 is illustrated as an example application of a read channel with correlation based data alignment in accordance with some embodiments of the present invention. The storage system 200 includes a read channel circuit 202 with a read channel with correlation based data alignment in accordance with some embodiments of the present invention. Storage system 200 may be, but is not limited to, a hard disk drive. Storage system 200 also includes a preamplifier 204, an interface controller 206, a hard disk controller 210, a motor controller 212, a spindle motor 214, a disk platter 216, and a read/write head assembly 220. Interface controller 206 controls addressing and timing of data to/from disk platter 216. The data on disk platter 216 consists of groups of magnetic signals that may be detected by read/write head assembly 220 when the assembly is properly positioned over disk platter 216. In one embodiment, disk platter 216 includes magnetic signals recorded in accordance with either a longitudinal or a perpendicular recording scheme.

In a typical read operation, read/write head assembly 220 is accurately positioned by motor controller 212 over a desired data track on disk platter 216. Motor controller 212 both positions read/write head assembly 220 in relation to disk platter 216 and drives spindle motor 214 by moving read/write head assembly 220 to the proper data track on disk platter 216 under the direction of hard disk controller 210. Spindle motor 214 spins disk platter 216 at a determined spin rate (RPMs). Once read/write head assembly 220 is positioned adjacent the proper data track, magnetic signals representing data on disk platter 216 are sensed by read/write head assembly 220 as disk platter 216 is rotated by spindle motor 214. The sensed magnetic signals are provided as a continuous, minute analog signal representative of the magnetic data on disk platter 216. This minute analog signal is transferred from read/write head assembly 220 to read channel circuit 202 via preamplifier 204. Preamplifier 204 is operable to amplify the minute analog signals accessed from disk platter 216. In turn, read channel circuit 202 decodes and digitizes the received analog signal to recreate the information originally written to disk platter 216. This data is provided as read data 222 to a receiving circuit. While processing the read data, read channel circuit 202 processes the received signal using a read channel with correlation based data alignment. In some cases, read/write head 220 is caused to repeatedly read data from the disk platter 216, yielding multiple versions of the data, which are aligned using correlation based data alignment in read channel 202. A write operation is substantially the opposite of the preceding read operation with write data 224 being provided to read channel circuit 202. This data is then encoded and written to disk platter 216.

It should be noted that storage system 200 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 200, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 200 may be modified to include solid state memory that is used to store data in addition to the storage offered by disk platter

216. This solid state memory may be used in parallel to disk platter 216 to provide additional storage. In such a case, the solid state memory receives and provides information directly to read channel circuit 202. Alternatively, the solid state memory may be used as a cache where it offers faster access time than that offered by disk platter 216. In such a case, the solid state memory may be disposed between interface controller 206 and read channel circuit 202 where it operates as a pass through to disk platter 216 when requested data is not available in the solid state memory or when the solid state memory does not have sufficient storage to hold a newly written data set. Based upon the disclosure provided herein, one of ordinary skill in the art will recognize a variety of storage systems including both disk platter 216 and a solid state memory.

Figure 3:
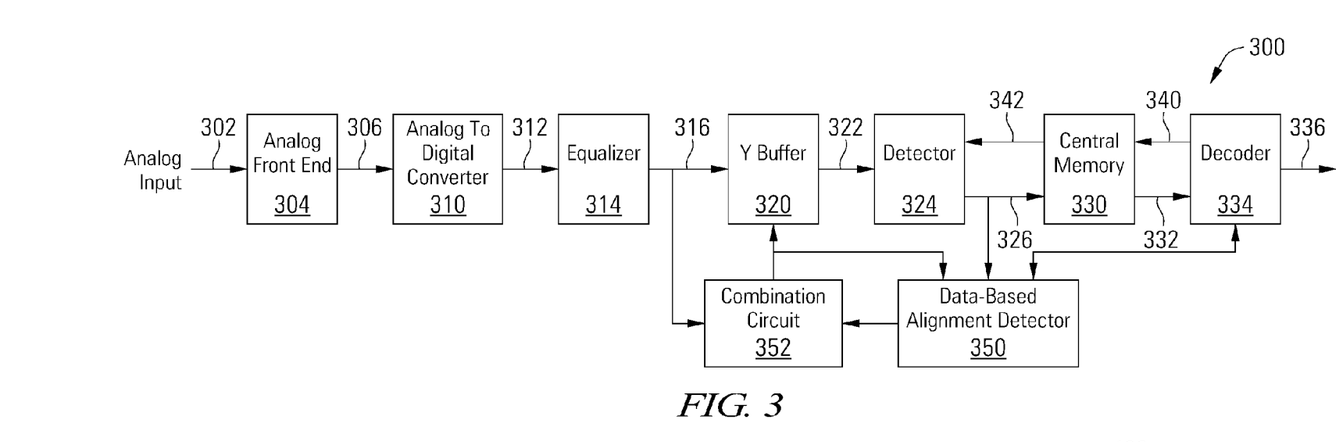
FIG. 3 is a block diagram of a read channel with correlation based data alignment in accordance with some embodiments of the present invention.

Turning to FIG. 3, a read channel 300 with correlation based data alignment is disclosed in accordance with some embodiments of the present invention. The read channel 300 performs data detection and decoding functions to detect the correct values of data that is received or retrieved from a source such as a storage medium. The read channel 300 receives an analog signal 302, which in some embodiments is derived from a read/write head assembly in a magnetic storage medium. Based upon the disclosure provided herein, one of ordinary skill in the art will recognize a variety of sources from which analog signal 302 may be derived.

The read channel 300 includes an analog front end 304 that receives and processes the analog signal 302. Analog front end 304 may include, but is not limited to, an analog filter and an amplifier circuit as are known in the art. Based upon the disclosure provided herein, one of ordinary skill in the art will recognize a variety of circuitry that may be included as part of analog front end 304. In some cases, the gain of a variable gain amplifier included as part of analog front end 304 may be modifiable, and the cutoff frequency and boost of an analog filter included in analog front end 304 may be modifiable. Analog front end 304 receives and processes the analog signal 302, and provides a processed analog signal 306 to an analog to digital converter 310.

Analog to digital converter 310 converts processed analog signal 306 into a corresponding series of digital samples 312. Analog to digital converter 310 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 312 are provided to an equalizer 314. Equalizer 314 applies an equalization algorithm to digital samples 312 to yield an equalized output 316, also referred to herein as y-samples. In some embodiments of the present invention, equalizer 314 is a digital finite impulse response filter circuit as is known in the art. Equalizer 314 ensures that equalized output 316 has the desired spectrum for a data detector 324.

Equalized output 316 is provided to a buffer 320 that includes sufficient memory to maintain one or more codewords until processing of that codeword is completed through a data detector 324 and a data decoder 334 including, where warranted, multiple "global iterations" defined as passes through both data detector 324 and data decoder 334 and/or "local iterations" defined as passes through data decoder 334 during a given global iteration. The equalized output 316 provided to buffer 320 in read channel 300 may be provided by components such as the analog front end 304, analog to digital converter 310, and equalizer 314, or by other or additional circuits performing functions such as DC compensation, cancellation of inter-track interference, or other functions. In other embodiments, digital data provided to buffer 320 may be derived from other sources, including digital data sources.

Buffered data 322 from buffer 320 is provided to a data detector 324 which applies a data detection algorithm to buffered data 322 to detect the correct values of data bits or symbols in buffered data 322, resulting in a detected output 326, also referred to herein as detected data bits or non-return to zero (NRZ) data. In some embodiments of the present invention, data detector 324 is a Viterbi algorithm data detector circuit as are known in the art. In other embodiments of the present invention, data detector 324 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, a Viterbi detection algorithm or Viterbi algorithm detector circuit that operates on wide bi-phase encoded user data. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector 324 is started based upon availability of a data set in buffer 320 from equalizer 314 or other source, or from a central memory circuit 330.

Upon completion, data detector 324 provides detected output 326 which includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 326 is stored in central memory 330.

Once data decoder 334 is available, a previously stored detected output 326 is accessed from central memory 330 and provided to data decoder 334 as decoder input 332. Data decoder 334 applies a data decoding algorithm to decoder input 332 in an attempt to recover originally written data. The result of the data decoding algorithm is provided as a decoded output 340. Similar to detected output 326, decoded output 340 may include both hard decisions and soft decisions. Data decoder 334 may be any data decoder circuit known in the art that is capable of applying a decoding algorithm to a received input. Data decoder 334 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs, data decoder 334 provides the result of the data decoding algorithm as a data output 336.

One or more iterations through the combination of data detector 324 and data decoder 334 may be made in an effort to converge on the originally written data set. As mentioned above, processing through both the data detector 324 and the data decoder 334 is referred to as a "global iteration". For the first global iteration, data detector 324 applies the data detection algorithm without guidance from a decoded output. For subsequent global iterations, data detector circuit 324 applies the data detection algorithm to buffered data 322 as guided by decoded output 340. Where the data decoding algorithm as applied by data decoder 334 fails to converge, decoder output 340 from data decoder 334 is transferred back to central memory circuit 330. Once data detector 324 is available, the decoder output 340 is provided to data detector 324 as stored decoder output 342 where it is used to guide subsequent detection of a corresponding data set received as stored equalized output 322 from buffer 320.

During each global iteration it is possible for data decoder 334 to make one or more local iterations including application of the data decoding algorithm to decoder input 332. For the first local iteration, data decoder 332 applies the data decoder algorithm without guidance from a decoded output 336. For subsequent local iterations, data decoder 350 applies the data decoding algorithm to decoder input 332 as guided by the results of previous local decoding iterations. In some embodiments of the present invention, a default of ten local iterations is allowed for each global iteration.

Where data fails to converge in a detection/decoding process, for example when parity checks result in errors in decoder 334 after a limit is reached on the number of local and global iterations for a data sector, a retry feature may be triggered in which multiple versions of the data are read. In other embodiments, multiple versions of a data sector may be read during normal processing. When multiple versions of data are to be used, the multiple versions are correlated and aligned in data-based alignment detector 350. Data to be correlated may be obtained as NRZ data in detected output 326, or as y-samples in equalizer output 316 from equalizer 314 or buffer 320, as decoder output 332, or any other suitable source in read channel 300. In some embodiments, a combination circuit 352 is used to combine aligned data based on offsets calculated by data-based alignment detector 350. In some embodiments, combination circuit 352 is an averaging circuit operable to average multiple versions of each data bit in a data sector, thereby averaging out the effects of noise and helping the detector 324 and decoder 334 to converge on the correct values. In some embodiments, combination circuit 352 is a controller operable to coordinate a multiple signal joint detection/decoding operation using multiple versions of data in detector 324 and decoder 334. However, the correlation based data alignment disclosed herein is not limited to use with any particular application.

Figure 4:
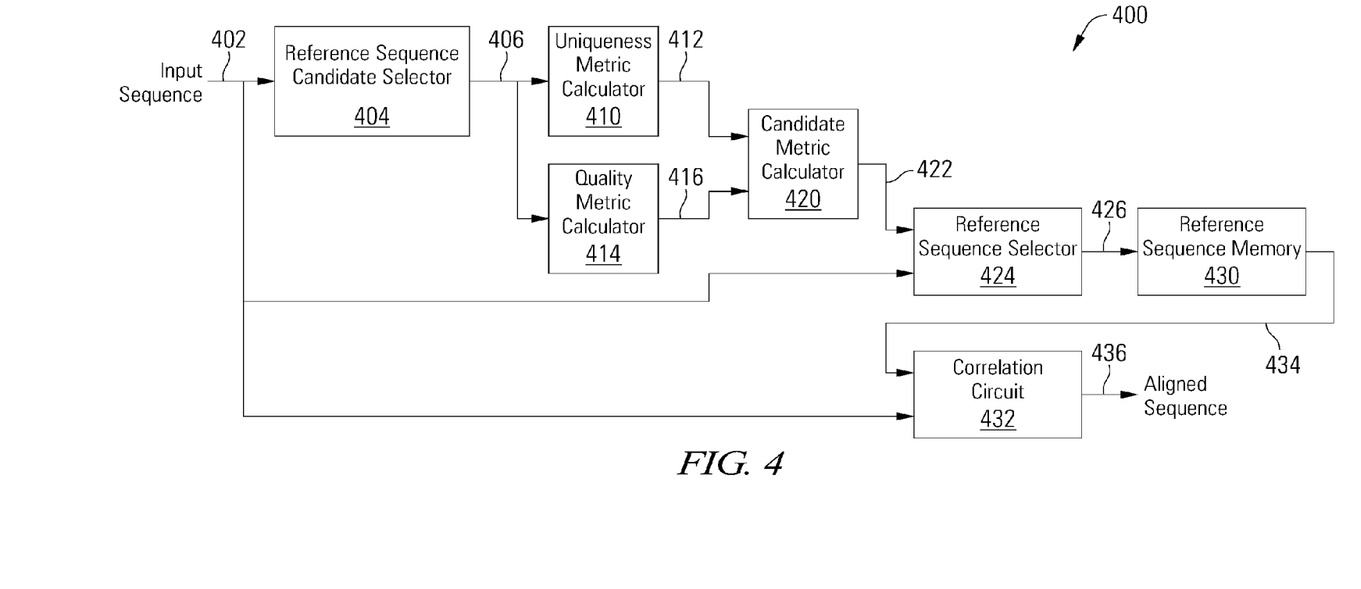
FIG. 4 is a block diagram of a data-based alignment detector with reference sequence selection based on metrics and with distance-based correlation in accordance with some embodiments of the present invention.

Turning to FIG. 4, a data-based alignment detector 400 with reference sequence selection based on metrics and with distance-based correlation is disclosed in accordance with some embodiments of the present invention. In this embodiment, multiple versions of data are correlated by selecting a reference sequence in one version of the data, then searching for the reference sequence in other versions of the data. In some embodiments, the Hamming distance between the reference sequence and another version of the data is used as a correlation metric. In some embodiments, the reference sequence is captured during the first re-read during a retry operation after a normal detection/decoding operation fails to converge. In other embodiments, the reference sequence is captured during another read operation.

The alignment detector 400 receives an input sequence 402, in some embodiments an NRZ data stream at the output of a data detector for a sector being read. For example, in some embodiments, the input sequence 402 includes about 5000 bits of user data corresponding to a data sector, substantially excluding a repeating preamble field at the start of the user data. In other embodiments, the input sequence 402 includes y-samples from an equalizer circuit. The alignment detector 400 is not limited to use with any particular type or source of digital input data. The alignment detector 400 can be configured to operate with either binary or non-binary data, and is not limited to any particular data format.

The alignment detector 400 processes the input sequence 402, selecting a portion of the input sequence 402 to be used in the correlation process to calculate the offset between different versions of data at the input sequence 402. The reference sequence is selected by the alignment detector 400 using a metric such that the reference sequence is a unique and repeatable pattern in the input sequence 402 that can likely be found in other versions of the data at the input sequence 402. The reference sequence is not predetermined in some embodiments, but is any portion of the input data that is unique, meaning it is unlikely to occur at multiple locations in the input sequence 402, and repeatable, meaning that multiple read operations will yield substantially the same reference sequence despite different noise conditions during the read operations. For example, a reference sequence made up of a repeating preamble pattern such as a repeating "1100" pattern would not be unique, because the reference sequence could be found at multiple locations, i.e., at every four-bit offset where the "1100" pattern is repeated. The reference sequence is a segment of the input sequence 402 having any suitable length, such as, but not limited to, 128 bits.

A reference sequence candidate selector 404 in the alignment detector 400 divides the input sequence 402 into a number of candidate reference sequences. The reference sequence candidate selector 404 may be any circuit known in the art that is capable of yielding portions of the input sequence 402, such as, but not limited to, a shift register. Based upon the disclosure provided herein, one of ordinary skill in the art will recognize a variety of circuits that may be used to yield candidate reference sequences from input sequence 402 in relation to different embodiments of the present invention. The input sequence 402 may be partitioned into candidate reference sequences in any suitable manner, such as by dividing the input sequence 402 into consecutive segments each with the length of the reference sequence, or by periodically taking candidate reference sequences from the input sequence 402 with unused bit sequences between each candidate, or in overlapping fashion with some bits reused in multiple candidate reference sequences, with the extreme example yielding a candidate reference sequence each time a new bit is received at input sequence 402 by shifting in the new bit and dropping the oldest bit from the previous candidate reference sequence to form the newest candidate reference sequence.

A uniqueness metric 412 is calculated for each candidate reference sequence by a uniqueness metric calculator 410. The uniqueness metric 412 is calculated by comparing the candidate reference sequence with other data sequences in input sequence 402 and establishing a preference for candidate reference sequences that are most unlike other data sequences. In some embodiments, it can be assumed that multiple read operations will yield data with a maximum offset within a window, such as, but not limited to, plus or minus 24 bits. In such embodiments, the candidate reference sequence is compared with other data sequences from the same read operation that are offset by i bits, where i takes on each value within the offset window except for 0, to avoid comparing the candidate reference sequence with itself. In an embodiment in which the window is plus or minus 24 bits, for each uniqueness metric calculation, i takes on a different value from −24 to −1 and from 1 to 24. In some embodiments, the uniqueness metric 412 is calculated using the Hamming distance between the candidate reference sequence and neighboring data sequences according to the following equation:

$$U_k = \min(\text{sum}([a_{128k}, \ldots, a_{128k+127}] \sim= [a_{128k+i}, \ldots, a_{128k+127+i}]))i=[-24: -1,1:24]$$

where $U_k$ is the uniqueness metric for a candidate reference sequence, where $[a_{128k}, \ldots, a_{128k+127}]$ is the candidate reference sequence, and where $[a_{128k+i}, \ldots, a_{128k+127+i}]$ is a neighboring data sequence offset by i. The notation 128k refers to the location of a candidate reference sequence, with k being a chunk index or candidate reference sequence, in an embodiment in which the input sequence 402 is partitioned into consecutive, non-overlapping candidate reference sequences with no gaps. In other embodiments, each candidate reference sequence may be indexed in other manners. The ~=operator identifies each bit that is different between the candidate reference sequence and the neighboring data sequence offset by i. The sum function calculates the Hamming distance between the candidate reference sequence and the neighboring data sequence offset by i, yielding the number of bits that are different between the two data sequences. The min function yields the Hamming distance between the candidate reference sequence and the most similar neighboring data sequence, that is, the lowest Hamming distance. The uniqueness metric 412 $U_k$ will therefore be a higher number when the candidate reference sequence is more unique when compared with neighboring data sequences, and a lower number when at least one of the neighboring data sequences is more like the candidate reference sequence. The uniqueness metric calculator 410 may be any circuit known in the art that is capable of yielding a metric representing how similar the candidate reference sequence is to the most similar neighboring data sequence, such as, but not limited to, a Hamming distance calculator and comparator. Based upon the disclosure provided herein, one of ordinary skill in the art will recognize a variety of circuits that may be used to calculate uniqueness metric 412 in relation to different embodiments of the present invention.

A quality metric 416 (or repeatability metric) is calculated for each candidate reference sequence by a quality metric calculator 414, representing the reliability that the candidate reference sequence will be repeated without substantial changes over multiple read operations. In some embodiments, the quality metric 416 is calculated based on log likelihood ratio values of detected data at input sequence 402, calculated by a soft output Viterbi algorithm data detector. Such log likelihood ratio values represent the likelihood that a data bit or symbol has a particular value. A higher log likelihood ratio value is an indication that the value of the data bit was relatively unaffected by noise, media defects or other problems, and it can be assumed that a subsequent read is likely to result in the same value for the data bit. During normal operation, noise conditions may vary between subsequent read operations, and the data sequences corresponding to the reference sequence may have some differences due to the noise. By selecting a candidate reference sequence with a higher quality metric 416 as the reference sequence to use during data correlation, the chances are increased that the reference sequence will remain relatively unchanged across multiple read operations and that it can therefore be identified in the input sequence 402 from subsequent read operations.

The quality metric calculator 414 calculates the quality metric 416 in some embodiments by comparing the log likelihood ratio value for the most likely value of each bit in the candidate reference sequence with a threshold value, according to the following equation:

$$Q_k = \text{sum}([|L_{128k}|>T, |L_{128k+1}|>T, \ldots, |L_{128k+127}|>T])$$

where $Q_k$ is the quality metric for a candidate reference sequence, $L_{128k}$ is the log likelihood ratio value of a bit or symbol in the candidate reference sequence, and T is a threshold value. The quality metric $Q_k$ in some embodiments thus represents the number of bits in the candidate reference sequence for which the highest log likelihood ratio value is greater than the threshold. Generally then, the quality metric 416 $Q_k$ will therefore be a higher number when detected values of the bits in the candidate reference sequence have a higher likelihood of being correct, and a lower number when detected values of the bits have a lower likelihood of being correct. The quality metric calculator 414 may be any circuit known in the art that is capable of yielding a metric representing the quality of the data at the input sequence 402. Any suitable quality metric may be used, and based upon the disclosure provided herein, one of ordinary skill in the art will recognize a variety of circuits that may be used to calculate quality metric 416 in relation to different embodiments of the present invention.

The uniqueness metric 412 $U_k$ and the quality metric 416 $Q_k$ are combined in a candidate metric calculator 420 to yield an overall candidate metric 422. In some embodiments, the candidate metric calculator 420 comprises a multiplication circuit that calculates the candidate metric 422 as $U_k * Q_k$. In some embodiments, the candidate metric calculator 420 comprises a circuit configured to perform a two dimensional optimization of $U_k$ and $Q_k$. Based upon the disclosure provided herein, one of ordinary skill in the art will recognize a variety of circuits that may be used to calculate a candidate metric 422 based on the uniqueness metric 412 $U_k$ and the quality metric 416 $Q_k$ in relation to different embodiments of the present invention.

A reference sequence selector 424 selects one of the candidate reference sequences as the reference sequence to use during data correlation, based on the candidate metric 422, yielding reference sequence 426. In some embodiments, the reference sequence selector 424 selects the candidate reference sequence with the highest value of candidate metric 422. In such embodiments, the reference sequence selector 424 may include a comparator circuit. Based upon the disclosure provided herein, one of ordinary skill in the art will recognize a variety of circuits that may be used to select the reference sequence 426 based on the candidate metric 422 in relation to different embodiments of the present invention. The reference sequence 426 $[a_{128k}, \ldots, a_{128k+127}]$ is stored in a reference sequence memory 430, along with the chunk index k that identifies the location of the reference sequence in the version of the input sequence 402 from which the reference sequence was selected.

During other read operations for the data sector, which yield other versions of the same data at input sequence 402, a correlation circuit 432 searches for the recorded reference sequence 434 in the input sequence 402 in order to determine any offset between data from the read operation yielding the reference sequence and from other read operations. In some embodiments, the correlation is a bit by bit operation, searching for the reference sequence 434 at each possible offset value within the expected offset window. In some embodiments, the possible offset value ranges from plus to minus 24, including an offset of 0. In some embodiments, the reference sequence 434 is searched for within the window in input sequence 402 by calculating the Hamming distances according to the following equation:

$$m = \mathrm{argmin}(\mathrm{sum}([a_{128k}, \ldots, a_{128k+127}]\mathbin{\sim}= [\tilde{a}_{128k+i}, \ldots, \tilde{a}_{128k+127+i}])), -24 \leq i \leq 24$$

where m is the offset between the data from the read operation yielding the reference sequence 434 and from the current read operation, $[a_{128k}, \ldots, a_{128k+127}]$ is the reference sequence 434, and $[\tilde{a}_{128k+i}, \ldots, \tilde{a}_{128k+127+i}]$ is a data sequence from the current read operation with the same length as the reference sequence 434 and an offset of i. The $\mathbin{\sim}=$ operator identifies each bit that is different between the reference sequence 434 and the current data sequence offset by i. The sum function calculates the Hamming distance between the reference sequence 434 and the current data sequence offset by i. The argmin function yields the offset m of the current data sequence offset by i with the lowest Hamming distance to the reference sequence 434.

Figure 5:
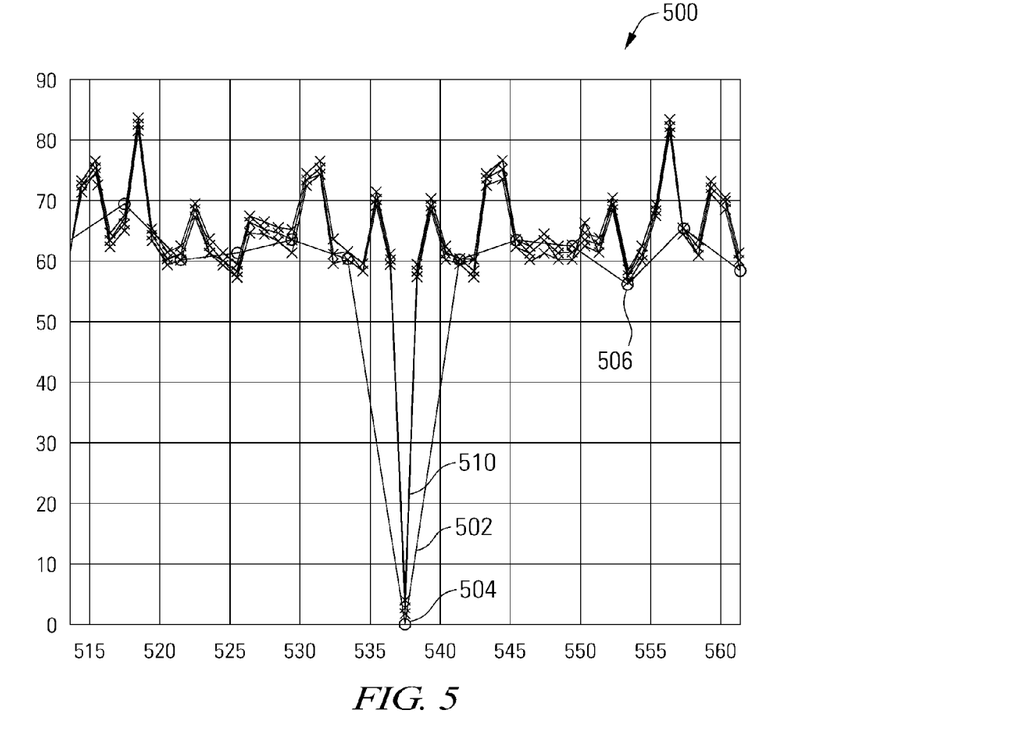
FIG. 5 is a plot of distances between a reference sequence and additional sequences within a target window as are calculated in some embodiments of the data-based alignment detector of FIG. 4.

Turning to FIG. 5, a plot 500 shows distances between a reference sequence 434 and neighboring data sequences from other read operations for each offset value m within a window. The X axis of plot 500 corresponds to the data bit index, and the Y axis corresponds to Hamming distances between data sequences. The index of the reference sequence in this example is at 537, with the X axis scaled to show the plus or minus 24 bit window of possible offset values m. One trace 502 shows the Hamming distance between the reference sequence and its neighboring data sequences within a single read operation, illustrating the uniqueness characteristic of the reference sequence. Notably, the Hamming distance between the reference sequence and itself in a single read operation, at the point 504 where the offset m is 0 at bit index 537, is also 0. However, the Hamming distance between the reference sequence and neighboring data sequences in the same read operation, shown by other points on the same trace 502, have a minimum Hamming distance of about 58 at point 506. The reference sequence is thus unique within the window of possible offset values to a degree that prevents false detection. Other traces (e.g., 510) show the Hamming distances between the reference sequence and its neighboring data sequences within subsequent read operations, with each of the data sequences aligned in plot 500 for clarity. In other words, although there may be non-zero values of offset m between data from the read operations shown in plot 500, those offset values have been corrected in plot 500 to show the relationships between the Hamming distances. Notably, the Hamming distances between the reference sequence and the matching data sequences from other read operations are below about 5 in this example where the reference sequence is correlated or aligned with the matching data sequences. However, the Hamming distances between the reference sequence and the non-matching neighboring data sequences in multiple read operations are greater than about 58. This enables the correlation circuit 432 to find the reference sequence within the possible offset window of subsequent read operations, even if noise has caused a few bits to be changed between read operations. Once the reference sequence has been found, the offset value m is identified, enabling the data from multiple read operations to be aligned. The correlation circuit 432 thus yields aligned sequences 436.

Figure 6:
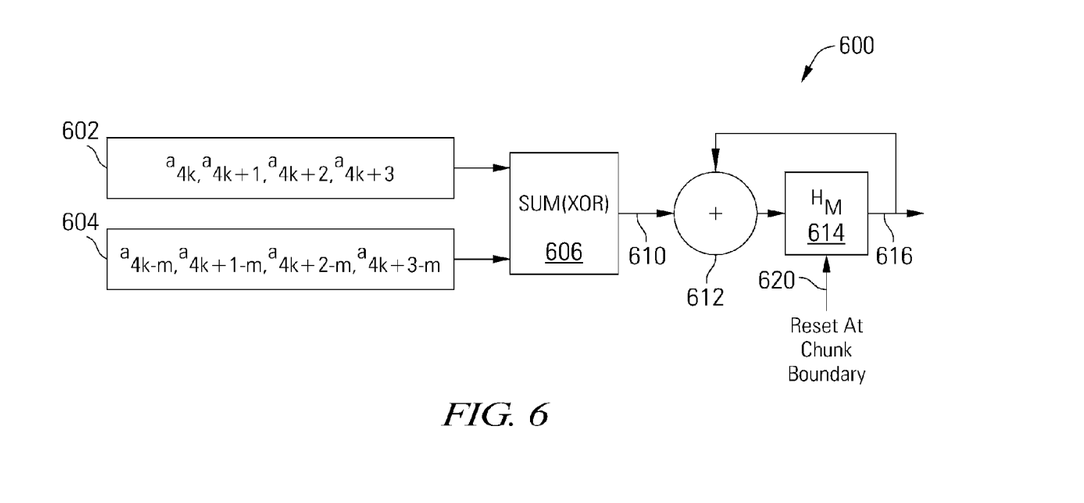
FIG. 6 is a block diagram of a modular correlation circuit suitable for use in some embodiments of the data-based alignment detector of FIG. 4.

Turning to FIG. 6, a block diagram depicts a modular correlation circuit 600 suitable for use in some embodiments of the data-based alignment detector of FIG. 4. The correlation is performed in some embodiments using a number of parallel circuits for calculating the Hamming distances and performing the comparisons, each circuit for a different offset value i. However, the correlation can also be performed using the modular correlation circuit 600 for each correlation shift amount, by adding portions of the reference sequence 602 with portions of target data sequences 604 as they are received using an adder 606. In some embodiments, adder 606 comprises an XOR circuit to identify bit differences. The result 610 is accumulated in accumulator 612. A Hamming calculator calculates the hamming distance for each correlation shift amount according to the following equation:

$$H_m = [a_{128k}, \ldots, a_{128k+127}] \mathbin{\sim}= [\tilde{a}_{128k-m}, \ldots, \tilde{a}_{128k+127-m}], m = [-24:-1, 1:24]$$

where m is the offset between the data from the read operation yielding the reference sequence 434 and from the current read operation.

The output 616 of the accumulator 612 is reset at each chunk boundary by a reset signal 620, resetting the calculated Hamming distance $H_m$ calculated by Hamming calculator 614 after processing the number of bits in the reference sequence. The modular correlation circuit 600 can process the input data sequences bit by bit, or in consecutive sequences having any desired length, in order to balance the complexity of the modular correlation circuit 600 with the size of the modular correlation circuit 600.

Figure 7:
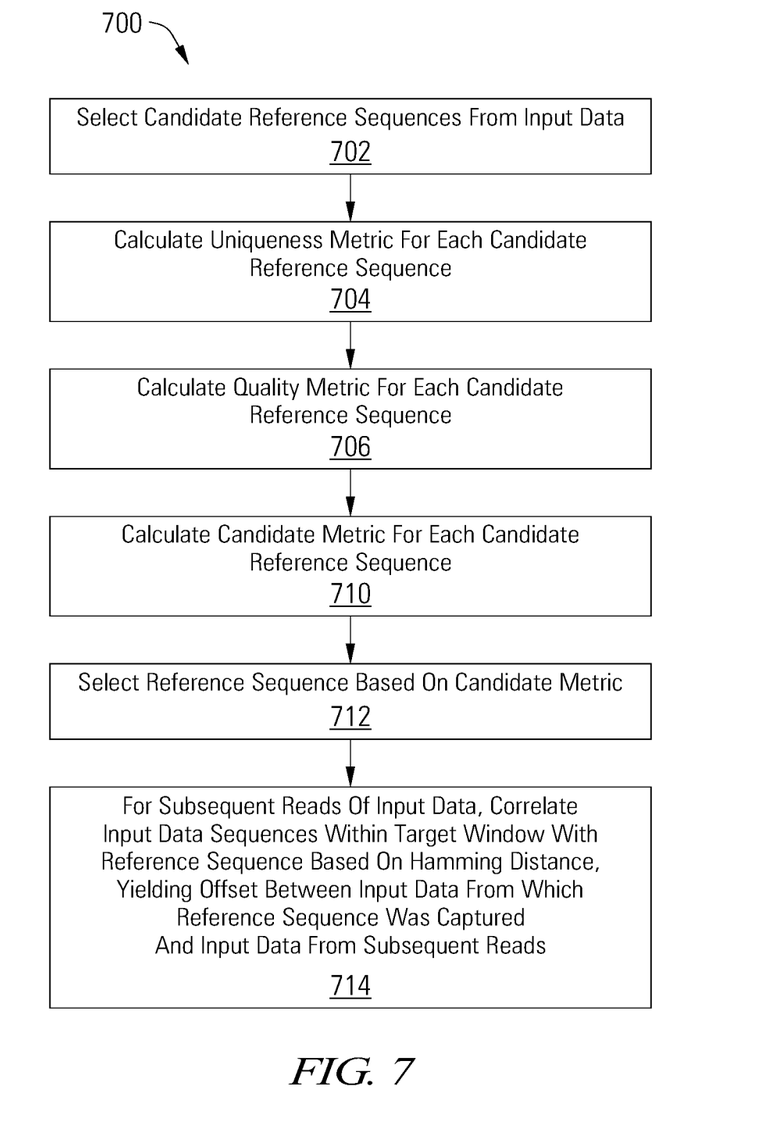
FIG. 7 depicts a flow diagram of an operation for data alignment including metric-based reference sequence selection and distance-based correlation in accordance with some embodiments of the present invention.

Turning to FIG. 7, a flow diagram 700 depicts an operation for data alignment including metric-based reference sequence selection and distance-based correlation in accordance with some embodiments of the present invention. Following flow diagram 700, candidate reference sequences are selected from input data (Block 702). The input data can be partitioned into candidate reference sequences in any suitable manner, ranging from overlapping bit by bit sequences from the input data to periodic, separated segments from the input data. A uniqueness metric is calculated for each candidate reference sequence (Block 704). In some embodiments, this is performed by calculating and comparing the Hamming distance between a candidate reference sequence and its offset data sequences with a possible offset window, and yielding the smallest resulting Hamming distance. A quality metric is calculated for each candidate reference sequence (Block 706). In some embodiments, this is performed by adding the number of bits in the candidate reference sequence for which the most likely log likelihood ratio value of a detected value for the bits are greater than a threshold. A candidate metric is calculated for each candidate reference sequence (Block 710). In some embodiments, this is performed by multiplying the uniqueness metric and the quality metric. A reference sequence is selected based on the candidate metric (Block 712). In some embodiments, this is performed by selecting the candidate reference with the lowest candidate metric. For subsequent reads of input data, input data sequences within a target window are correlated with the reference sequence based on the Hamming distances, yielding the offset between the input data from which the reference sequence was captured and input data from subsequent reads (Block 714). Given the offsets, the data from the various read operations can be aligned by shifting the data by the corresponding offsets.

Figure 8:
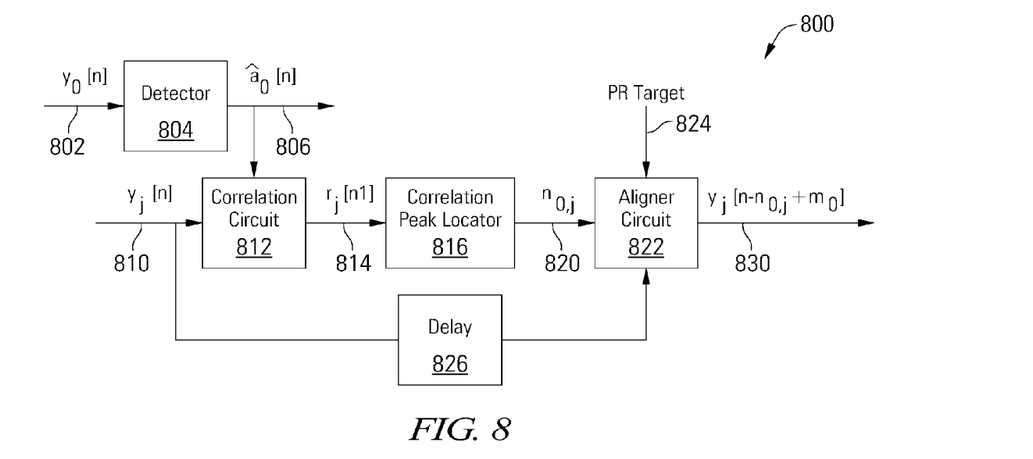
FIG. 8 is a block diagram of a data-based alignment detector with data combination and partial response peak detection in accordance with some embodiments of the present invention.

Turning to FIG. 8, a data-based alignment detector 800 is depicted which includes data combination and partial response peak detection in accordance with some embodiments of the present invention. In this embodiment, multiple versions of data are correlated based on a comparison of a partial response target used to generate the data and estimated partial response targets of additional read operations. The alignment detector 800 receives an input sequence 802 $y_0[n]$. In some embodiments, input sequence 802 includes y-samples that have been filtered in an equalizer circuit, a digital finite impulse response filter (e.g., 314), with the filter tap coefficients (and thus the filter characteristics) adapted based on a partial response target $g_i$.

A data detector 804 processes the input sequence 802, applying a data detection algorithm to input sequence 802 to detect the correct values of data bits or symbols in input sequence 802, resulting in a detected output 806, $â_0[n]$, also referred to herein as hard decisions, detected data bits or non-return to zero (NRZ) data. In some embodiments, data detector 804 corresponds with the data detector 324 of FIG. 3. In other embodiments, data detector 804 is a loop detector or other detector in a data processing system. In some embodiments of the present invention, data detector 804 is a Viterbi algorithm data detector circuit as are known in the art. In other embodiments of the present invention, data detector 804 is a maximum a posteriori data detector circuit as are known in the art.

The detected output 806 from a main read operation is used in combination with y-samples from other read operations to calculate an estimated partial response target. The main read operation may be, but is not limited to, the first read operation of a number of read operations performed during the correlation based data alignment. The y-samples from the main read operation can be represented by the following equation:

$$y_0[n] = \sum_{i=0}^{N_g-1} g_i a[n-i] + v_o[n]$$

where $N_g$ is the number of samples in the data set being processed, $g_i$ is the equalization partial response target, $a[n]$ are the data bits that were stored or transmitted, and $v_0[n]$ are the noise samples for the main read operation.

The y-samples from other read operations, and in general from the j'th read operation, can be represented by the following equation:

$$y_j[n] = \sum_{i=0}^{N_g-1} g_i a[n+n_j-i] + v_j[n]$$

where $N_g$ is the number of samples in the data set being processed, $g_i$ is the equalization partial response target, $a[n]$ are the data bits that were stored or transmitted, and $v_j[n]$ are the noise samples for the j'th read operation.

The location $m_0$ of the maximum partial response target tap coefficient is given by the following equation:

$$m_0 = \underset{i}{\mathrm{argmax}}\ \{g_i\}$$

where the arg function returns the index $m_0$ or location of the peak in partial response target $g_i$.

The correlation 814 for the j'th read operation is denoted as $r_j[n_1]$ and is calculated by correlation circuit 812 as the sum of the product of the detected output 806 from the main read operation and the y-samples 810 $y_j[n]$ from another read operation of the same data bits $a[n]$. The maximum of the correlation 814 is proportional to the maximum tap coefficient in the partial response target. The correlation 814, also referred to herein as the estimated partial response target, is calculated according to the following equation:

$$r_j[n_1] = \sum_n y_j[n] â_0[n+n_1]$$

where $r_j[n_1]$ is the correlation for the j'th read operation, and $n_1$ is an offset window, for example, but not limited to, $-24 < n_1 < 24$. The correlation circuit 812 calculates correlation $r_j[n_1]$ for each possible offset $n_1$ for a given read operation j, and the correlations $r_j[n_1]$ 814 will have a peak or maximum value that can be used in combination with a peak in the partial response target to align the data of read operation j with the main read operation (and therefore also with the data of other read operations).

The correlation circuit 812 may be any circuit known in the art that is capable of performing the equation shown above. Based upon the disclosure provided herein, one of ordinary skill in the art will recognize a variety of circuits that may be used in correlation circuit 812 relation to different embodiments of the present invention. In some embodiments, correlation circuit 812 is a convolution circuit, performing a bit by bit multiplication of y-samples 810 $y_j[n]$ with an offset version $â_0[n+n_1]$ of hard decisions 806, and summing the results. In some embodiments, hard decisions 806 either have a value of −1 or 1. In some such embodiments, the correlation circuit 812 comprises an adder that either adds or subtracts each bit of y-samples 810 $y_j[n]$, based on the value of each corresponding bit in the offset version $â_0[n+n_1]$ of hard decisions 806.

The input sequence 802, or y-samples from the main read operation, and the y-samples 810 $y_j[n]$ from the j'th read operation are equalized based on the same equalization partial response target $g_i$. The correlations $r_j[n_1]$ 814 over $n_1$ are proportional to the estimated partial response target, and will have a peak for one value of $n_1$ corresponding to a peak in the equalization partial response target $g_i$, and the shift amount or distance between those peaks gives the offset between the data from the main read operation and the data being correlated.

A correlation peak locator 816 searches for the peak in the correlations $r_j[n_1]$ 814 yielded by correlation circuit 812, which is the estimated partial response target based on the correct offset $n_1$ as identified by the correlation circuit 812. The correlation peak locator 816 in some embodiments identifies the location of the peak $n_{0,j}$ for read operation j in the correlations $r_j[n_1]$ 814 over the values of $n_1$ according to the following equation:

$$n_{0,j} = \underset{n_1}{\mathrm{argmax}}\ \{|r_j[n_1]|\}$$

where the arg function returns the index 820 $n_{0,j}$ or location of the peak in $|r_j[n_1]|$, the absolute value of the correlations $r_j[n_1]$ 814 containing the peak. The alignment difference between the y-samples 810 $\{y_j[n]\}$ from the j'th read operation and the y-samples 802 {$y_o[n]$} from the main read operation is given by $n_{o,j}-m_0$, where, again, $m_0$ is the location of the maximum tap coefficient in the partial response target. For example, if the partial response target (or the tap coefficients for equalization digital finite impulse response filter) is [8, 14, 2], then $m_0$ is 1, the index of the largest magnitude tap (14). If the partial response target (or the tap coefficients for equalization digital finite impulse response filter) is [14, 8, 2], then $m_0$ is 0, the index of the largest magnitude tap (14). The correlation peak locator 816 may be any circuit known in the art that is capable of performing the equation shown above. Based upon the disclosure provided herein, one of ordinary skill in the art will recognize a variety of circuits that may be used in correlation peak locator 816 in relation to different embodiments of the present invention, such as, but not limited to, a comparator.

The index 820 $n_{o,j}$ of the peak in the correlations 814 is provided to an aligner circuit 822. A delayed version of y-samples 810 $y_j[n]$, delayed by delay circuit 826 to match the delay of correlation circuit 812 and correlation peak locator 816, is also provided to aligner circuit 822, along with the equalization partial response target 824 $g_i$, which provides the value for $m_0$. The aligner circuit 822 shifts the y-samples 810 $y_j[n]$ according to the following equation, yielding aligned y-samples 830 $\hat{y}_j$:

$$\hat{y}_j[n]=y_j[n-n_{o,j}+m_0]$$

The aligner circuit 822 may be any circuit known in the art that is capable of shifting data according to the equation shown above. Based upon the disclosure provided herein, one of ordinary skill in the art will recognize a variety of circuits that may be used in aligner circuit 822 in relation to different embodiments of the present invention, such as, but not limited to, a memory controller to shift data in a memory or to adjust memory pointers.

Figure 9:
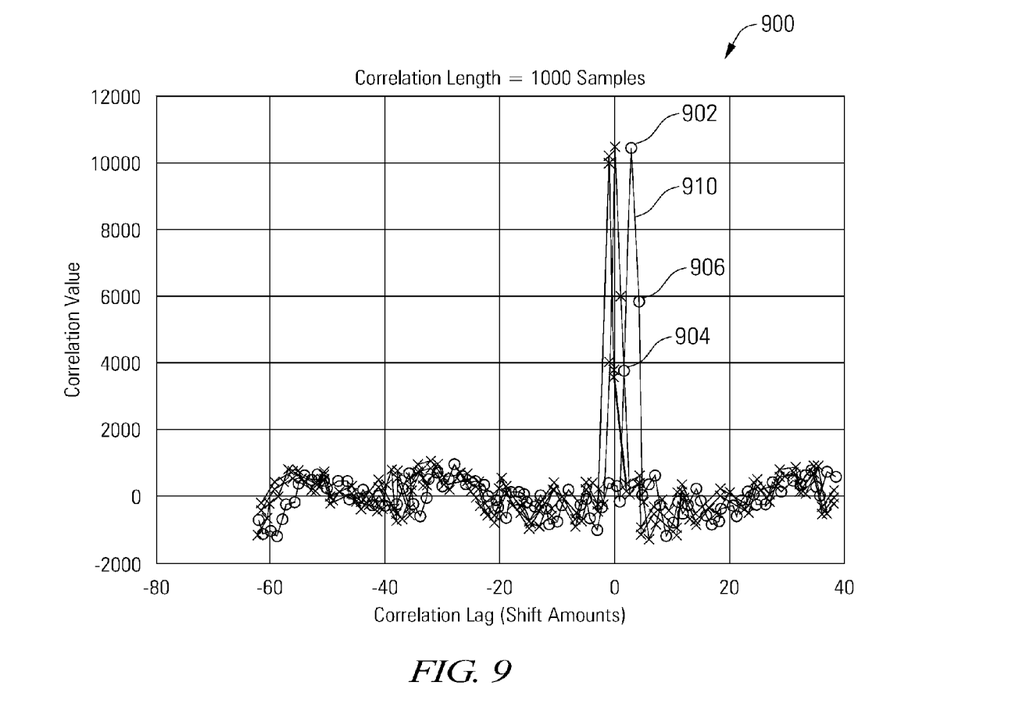
FIG. 9 is a plot of correlations as are calculated in some embodiments of the data-based alignment detector of FIG. 8.

Turning to FIG. 9, a plot 900 displays correlations as calculated in some embodiments of the data-based alignment detector 800 of FIG. 8. The offset or shift amounts $n_1$ of correlations $r_j[n_1]$ 814 correspond to the X axis of plot 900, and the correlation value corresponds to the Y axis. Each trace in plot 900 is defined by the values of correlations $r_j[n_1]$ 814 for one read operation j, with the value of offset $n_1$ changing along the X axis. Again, the values of correlations $r_j[n_1]$ 814 are proportional to the tap coefficients adapted based on the partial response target $g_i$. Each trace or plot of correlations $r_j[n_1]$ 814 varies around 0 based on noise values, but has a spike corresponding to the partial response target. For example, trace 910 has three points 902, 904, 906 that rise from the noise, with point 902 at the peak. If the correlations of trace 910 are scaled by the number of samples used, or by 1000 samples in the example plot 900, the resulting values for points 902, 904, 906 will be equal or substantially equal to the equalization partial response target used in the equalization process.

Figure 10:
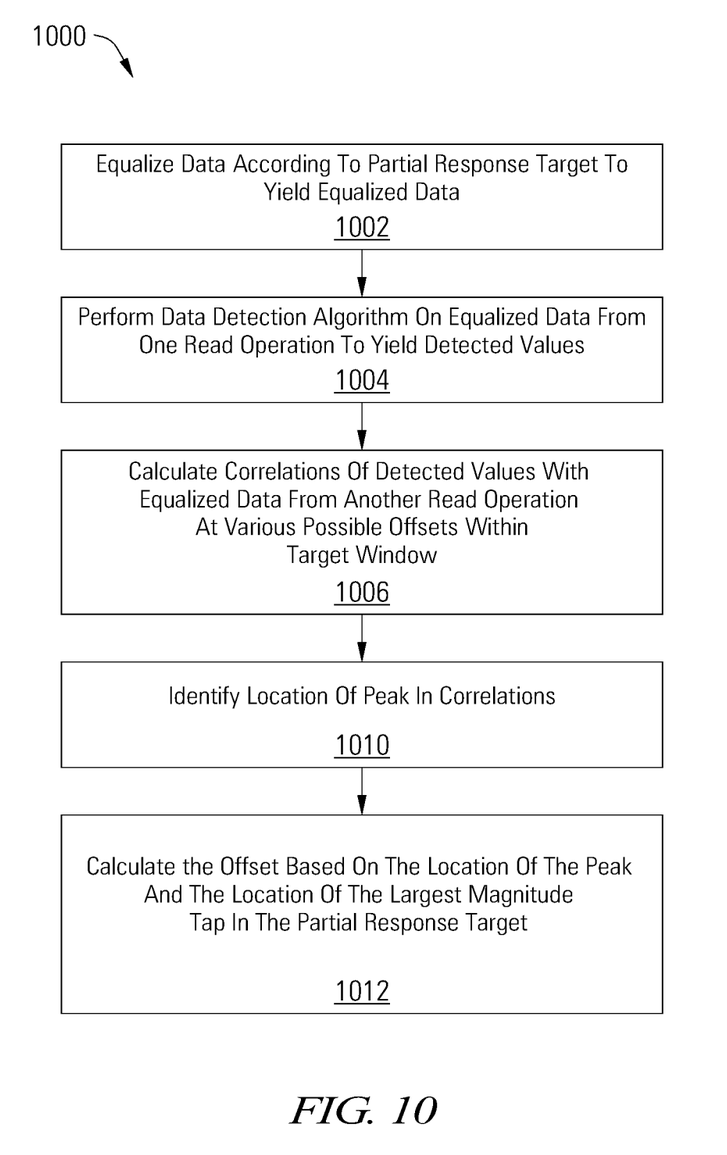
FIG. 10 depicts a flow diagram of an operation for data alignment including data combination and partial response peak detection in accordance with some embodiments of the present invention.

Turning to FIG. 10, a flow diagram 1000 depicts an operation for data alignment including data combination and partial response peak detection in accordance with some embodiments of the present invention. Following flow diagram 1000, data is equalized according to a partial response target to yield equalized data (Block 1002). A data detection algorithm is performed on the equalized data from one read operation to yield detected values (Block 1004). In some embodiments, the data detection algorithm comprises a Viterbi algorithm, and the detected values comprise hard decisions. The correlation of the detected values with equalized data from another read operation is calculated at various possible offsets within a target window (Block 1006). In some embodiments, the correlations are calculated as the sum of the products of each hard decision in the block of data or data sector being read, and each equalized data sample in the block of data from another read operation, with a correlation value calculated at each of the possible data offsets. The location of the peak in the correlations is located (Block 1010). In some embodiments, this involves identifying the offset value for which the calculated correlation value is the largest. The offset is calculated based on the location of the peak and the location of the largest magnitude tap in the partial response target (Block 1012).

Figure 11:
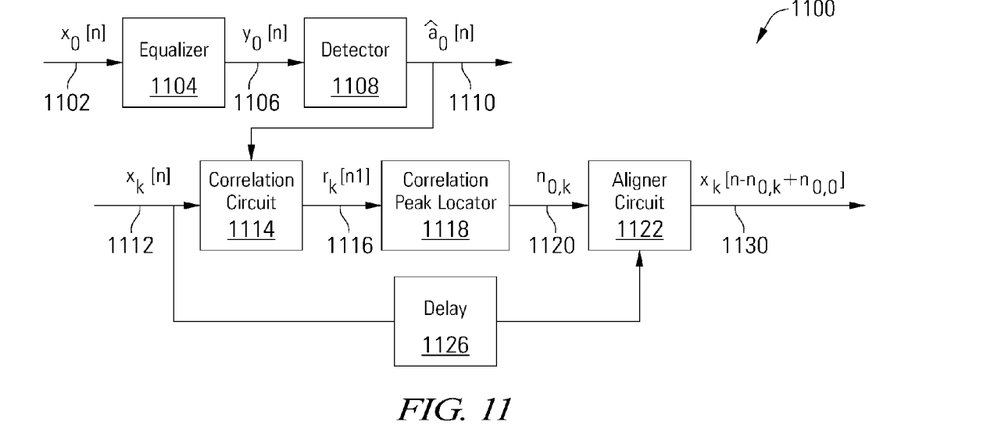
FIG. 11 is a block diagram of a data-based alignment detector with correlation of data samples with detected data bits in accordance with some embodiments of the present invention.

Turning to FIG. 11, a data-based alignment detector 1100 is depicted which correlates data samples at the equalizer input with detected data bits, with the resulting correlation having the shape of unequalized channel dibit response (rather than equalized partial response target). The location of the peak of this channel response is used to align multiple versions of data. The alignment detector 1100 receives an input sequence 1102 $x_0[n]$ of data samples, for example from an analog to digital converter. The input sequence 1102 is filtered in an equalizer circuit 1104, such as a digital finite impulse response filter, yielding y-samples 1106 $y_0[n]$.

A data detector 1108 processes the y-samples 1106, applying a data detection algorithm to detect the correct values of data bits or symbols in y-samples 1106, resulting in a detected output 1110, $\hat{a}_0[n]$, also referred to herein as hard decisions, detected data bits or non-return to zero (NRZ) data. In some embodiments of the present invention, data detector 1106 is a Viterbi algorithm data detector circuit as are known in the art. In other embodiments of the present invention, data detector 1106 is a maximum a posteriori data detector circuit as are known in the art.

The detected output 1110 $\hat{a}_0[n]$ from a main read operation is used in combination with x-samples, or data samples prior to equalization coming from the output of an analog to digital converter, from the main read operation or other read operations to estimate the unequalized channel dibit in input sequence 1102 $x_0[n]$ or 1112 $x_k[n]$. The main read operation may be, but is not limited to, the first or best read operation of a number of read operations performed during the correlation based data alignment. The x-samples from the main read operation and other read operations can be represented by the following equations:

$$x_0[n] = \sum_{i=-M_1}^{M_2} h_i a[n-i] + v_o[n]$$

$$x_k[n] = \sum_{i=-M_1}^{M_2} h_i a[n+n_k-i] + v_k[n]$$

where $-M_1$ to $M_2$ denote the span of inter-symbol interference, $h_i$ is the unequalized channel dibit response, a[n] are the data bits that were stored or transmitted, $v_o[n]$ are the noise samples for the main read operation, and $v_k[n]$ are the noise samples for the k'th read operation.

The correlation 1116 for the k'th read operation is denoted as $r_k[n_1]$ and is calculated by correlation circuit 1114 as the sum of the product of the x-samples 1112 $x_k[n]$ from the k'th read operation and the detected output 1110 from the main read operation of the same data bits. The correlation 1116, also referred to herein as the estimated unequalized channel dibit, is calculated according to the following equation:

$$r_k[n_1] = \sum_n x_k[n]\hat{a}_0[n+n_1]$$

where $r_k[n_1]$ is the correlation for the k'th read operation, and $n_1$ is an offset window, for example, but not limited to, $-24 < n_1 < 24$. The correlation circuit 1114 calculates correlation $r_k[n_1]$ for each possible offset $n_1$ for a given read operation k, and the correlations $r_k[n_1]$ 1116 will have a peak or maximum value that can be used in combination with a peak in the unequalized channel dibit obtained from correlating $x_0[n]$ with $\hat{a}_0[n]$ to align the data of read operation k with the main read operation (and therefore also with the data of other read operations). If the correlation peak $r_k[n_1]$ happens to be negative, then the corresponding x-samples $\{x_k[n]\}$ are inverted in polarity.

The correlation circuit 1114 may be any circuit known in the art that is capable of performing the equation shown above. Based upon the disclosure provided herein, one of ordinary skill in the art will recognize a variety of circuits that may be used in correlation circuit 1114 relation to different embodiments of the present invention. In some embodiments, correlation circuit 1114 is a convolution circuit, performing a bit by bit multiplication of x-samples 1112 $x_k[n]$ with an offset version $\hat{a}_0[n+n_1]$ of hard decisions 1110, and summing the results. In some embodiments, hard decisions 1110 either have a value of $-1$ or 1. In some such embodiments, the correlation circuit 1114 comprises an adder that either adds or subtracts each bit of x-samples 1112 $x_k[n]$, based on the value of each corresponding bit in the offset version $\hat{a}_0[n+n_1]$ of hard decisions 1110, performing a simple signed accumulation of the x-samples.

A correlation peak locator 1118 searches for the locations of peaks in correlations. The location of the peak in the unequalized channel dibit in input sequence 1102 $x_0[n]$ from the main read operation is calculated by correlating the input sequence 1102 $x_0[n]$ from the main read operation with the detected output 1110 $\hat{a}_0[n]$ from the main read operation according to the following equation:

$$r_0[n1] = \sum_n x_0[n]\hat{a}_0[n+n1]$$

where $\{\hat{a}_0[n]\}$ are the detected data bits from $\{x_0[n]\}$, and calculating the location $n_{0,0}$ of the peak in the correlation by the following equation:

$$n_{0,0} = \underset{n_1}{\operatorname{argmax}} \{|r_0[n_1]|\}$$

where the argmax function returns the index 1120 $n_{0,0}$ or location of the peak in $|r_0[n_1]|$, the absolute value of the correlations $r_0[n_1]$ 1116 containing the peak during the main read operation. Notably, the max-correlation is proportional to the max-tap in the unequalized channel dibit response.

The location $n_{0,k}$ of the peak in correlations for other read operations is given by the following equation:

$$n_{0,k} = \underset{n_1}{\operatorname{argmax}} \{|r_k[n_1]|\}$$

where the argmax function returns the index 1120 $n_{0,k}$ or location of the peak $|r_k[n_1]|$, the absolute value of the correlations $r_k[n_1]$ 1116 containing the peak during read operations other than the main read operation.

The alignment difference between input sequence 1102 $x_0[n]$ from the main read operation and input sequence 1112 $x_k[n]$ from other read operations is given by $n_{0,k} - n_{0,0}$, where $n_{0,0}$ is the location of the peak in $r_0[n]$. The correlation peak locator 1118 may be any circuit known in the art that is capable of performing the equation shown above. Based upon the disclosure provided herein, one of ordinary skill in the art will recognize a variety of circuits that may be used in correlation peak locator 1118 in relation to different embodiments of the present invention, such as, but not limited to, a comparator.

The indexes 1120 of the peak in the correlations 1116 are provided to an aligner circuit 1122. A delayed version of input sequence 1112 $x_k[n]$, delayed by delay circuit 1126 to match the delay of correlation circuit 1114 and correlation peak locator 1118, is also provided to aligner circuit 1122. The aligner circuit 1122 shifts the input sequence 1112 $x_k[n]$ according to the following equation, yielding aligned x-samples 1130 $\hat{x}_k[n]$:

$$\hat{x}_k[n] = x_k[n - n_{0,k} + n_{0,0}]$$

The aligner circuit 1122 may be any circuit known in the art that is capable of shifting data according to the equation shown above. Based upon the disclosure provided herein, one of ordinary skill in the art will recognize a variety of circuits that may be used in aligner circuit 1122 in relation to different embodiments of the present invention, such as, but not limited to, a memory controller to shift data in a memory or to adjust memory pointers. What results is an aligned set of x-sample streams, given by $\{x_0[n]\}$, $\{x_1[n-n_{0,1}+n_{0,0}]\}$, $\{x_2[n-n_{0,2}+n_{0,0}]\}$, $\{x_3[n-n_{0,3}+n_{0,0}]\}$, ....

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, embodiments of the present invention provide novel systems, devices, methods and arrangements for correlation based data alignment. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. A data processing system comprising:
    a data detector operable to apply a data detection algorithm to generate detected values for user data in a data sector;
    a data decoder operable to apply a data decode algorithm to a decoder input derived from the detected values to yield decoded values; and
    an alignment detector operable to calculate an offset between multiple versions of the same user data in the data sector by correlating the multiple versions.

2. The data processing system of claim 1, wherein the alignment detector is operable to select a reference sequence from one of the multiple versions and to search for the reference sequence in others of the multiple versions.

3. The data processing system of claim 2, further comprising a correlation circuit operable to calculate a distance between the reference sequence and each of a plurality of data sequences from one of the others of the multiple versions, wherein the offset comprises an index difference between the reference sequence and one of the plurality of data sequences from said one of the others of the multiple versions having a smallest distance.

4. The data processing system of claim 2, wherein the alignment detector comprises a candidate reference sequence selector operable to partition said one of the multiple versions to yield a plurality of candidate reference sequences.

5. The data processing system of claim 4, wherein the alignment detector comprises a uniqueness metric calculator operable to calculate a uniqueness metric for each of the plurality of candidate reference sequences.

6. The data processing system of claim 4, wherein the alignment detector comprises a quality metric calculator operable to calculate a repeatability metric for each of the plurality of candidate reference sequences.

7. The data processing system of claim 4, wherein the alignment detector is operable to select the reference sequence from among a plurality of candidate reference sequences based on metrics for repeatability and uniqueness.

8. The data processing system of claim 1, wherein the alignment detector comprises a correlation circuit operable to convolve the detected values with equalized data samples for a different one of the multiple versions of the data sector at each of a plurality of offset values to yield correlation values.

9. The data processing system of claim 8, further comprising a peak locator circuit operable to identify a largest one of the correlation values, and an aligner circuit operable to calculate the offset based on a difference between a location of the largest one of the correlation values and a location of a maximum tap coefficient used to equalize the equalized data samples.

10. The data processing system of claim 1, wherein the alignment detector comprises a correlation circuit operable to correlate x-samples for the data sector with the detected values to yield correlation values, further comprising a peak locator circuit operable to calculate a location of a peak in absolute values of the correlation values.

11. The data processing system of claim 1, wherein the data processing system is incorporated in a storage device.

12. A method of processing data, comprising:
    applying a data detection process to user data in a data sector to generate detected values for the user data in the data sector;
    applying a data decoding process to a decoder input derived from the detected values to yield decoded values; and
    detecting offsets between multiple versions of the same user data in the data sector by correlating the multiple versions.

13. The method of claim 12, further comprising aligning the multiple versions of the data sector based on the offsets.

14. The method of claim 12, wherein detecting the offsets comprises selecting candidate reference sequences from input data for the data sector.

15. The method of claim 14, wherein detecting the offsets further comprises calculating a uniqueness metric and a quality metric for each of the candidate reference sequences, and selecting one of the candidate reference sequences with a lowest combined uniqueness metric and quality metric as a reference sequence.

16. The method of claim 14, wherein detecting the offsets further comprises correlating the multiple versions of the data sector by searching for the reference sequence in least some of the multiple versions of the data sector.

17. The method of claim 12, wherein detecting the offsets between the multiple versions of the data sector comprises:
    convolving the detected values with equalized data samples from different ones of the multiple versions at each of a plurality of possible offset values to yield correlation values;
    identifying a location of a peak in the correlation values; and
    calculating one of the offsets based on the location of the peak in the correlation values and on a partial response target associated with the equalized data samples.

18. The method of claim 17, wherein said one of the offsets is calculated based on a difference between the location of the peak and a location of a maximum tap coefficient used to equalize the equalized data samples.

19. A storage system comprising:
    a storage medium;
    a head assembly disposed in relation to the storage medium and operable to provide a sensed signal corresponding to information on the storage medium;
    an analog to digital converter circuit operable to sample an analog signal derived from the sensed signal to yield a series of digital samples; and
    a data-based alignment detector operable to correlate and align the digital samples from a plurality of read operations for the same user data in the information on the storage medium.

20. The data processing system of claim 1, further comprising a combination circuit configured to combine the multiple versions of the same user data based on the offset calculated by the alignment detector.

* * * * *